United States Patent
Sirilla et al.

(10) Patent No.: US 7,738,039 B2
(45) Date of Patent: Jun. 15, 2010

(54) METHOD AND APPARATUS FOR SETTING A VOLTAGE CONTROLLED CRYSTAL OSCILLATOR IN A VIDEO PROCESSING DEVICE

(75) Inventors: George Andrew Sirilla, Indianapolis, IN (US); Robert Alan Pitsch, Carmel, IN (US)

(73) Assignee: Thomson Licensing, Boulogne-Billancourt (FR)

(*) Notice: Subject to any disclaimer, the term of this patent is extended or adjusted under 35 U.S.C. 154(b) by 802 days.

(21) Appl. No.: 10/587,757

(22) PCT Filed: Feb. 25, 2005

(86) PCT No.: PCT/US2005/006252

§ 371 (c)(1),
(2), (4) Date: Jul. 28, 2006

(87) PCT Pub. No.: WO2005/084037

PCT Pub. Date: Sep. 9, 2005

(65) Prior Publication Data

US 2007/0192783 A1 Aug. 16, 2007

Related U.S. Application Data

(60) Provisional application No. 60/548,145, filed on Feb. 26, 2004.

(51) Int. Cl.
*H04N 9/475* (2006.01)
(52) U.S. Cl. .................. 348/512; 348/536; 375/376
(58) Field of Classification Search .......... 348/512, 348/518, 536, 500; 375/376, 368, 371, 374
See application file for complete search history.

(56) References Cited

U.S. PATENT DOCUMENTS

| | | | |
|---|---|---|---|
| 4,959,715 A * | 9/1990 | Prodan | 348/448 |
| 5,612,981 A | 3/1997 | Huizer | |
| 5,699,392 A * | 12/1997 | Dokic | 375/376 |
| 5,742,191 A * | 4/1998 | Romesburg et al. | 327/156 |
| 5,920,572 A * | 7/1999 | Washington et al. | 370/535 |
| 6,356,871 B1 | 3/2002 | Hemkumar et al. | |
| 2003/0005348 A1 | 1/2003 | Furukawa et al. | |

FOREIGN PATENT DOCUMENTS

EP          1 324 619 A2     7/2003

OTHER PUBLICATIONS

European Search Report Dated Aug. 29, 2005.

* cited by examiner

*Primary Examiner*—M. Lee
(74) *Attorney, Agent, or Firm*—Robert D. Shedd; Joseph J Opalach; Brian J. Cromarty

(57) ABSTRACT

The present invention concerns a method and apparatus for setting a frequency reference in an integrated receiver decoder (IRD). More specifically, the present invention discloses an electrical circuit arrangement in which the voltage controlled crystal oscillator (VCXO) is set to oscillate at the desired frequency prior to the initial use thereof and that frequency is stored in a non-volatile memory unit. Upon initial use, the IRD receives a data signal corresponding to a frequency reference. The IRD uses a threshold value to compare the frequency reference of the incoming data signal with the frequency stored in the non-volatile memory. If the frequencies differ by a predetermined value, the frequency from the incoming data signal is stored in the non-volatile memory and is used to set the VCXO.

12 Claims, 8 Drawing Sheets

METHOD AND APPARATUS FOR SETTING A VOLTAGE CONTROLLED CRYSTAL OSCILLATOR IN A VIDEO PROCESSING DEVICE

This application claims the benefit, under 35 U.S.C. §365 of International Application PCT/US2005/006252, filed Feb. 25, 2005 which was published in accordance with PCT Article 21(2) on Sep. 9, 2005 in English and which claims the benefit of U.S. provisional patent application No. 60/548,145 filed Feb. 26, 2004.

PRIORITY CLAIM

This application claims the benefit of U.S. Provisional Patent Application No. 60/548,145, filed Feb. 26, 2004, entitled "METHOD AND APPARATUS FOR SETTING A VOLTAGE CONTROLLED CRYSTAL OSCILLATOR IN A VIDEO PLAYBACK DEVICE," which is incorporated herein by reference.

FIELD OF THE INVENTION

The present invention relates a video processing system.

BACKGROUND OF THE INVENTION

Satellite television receiving systems usually comprise an outdoor unit comprising a dish like antenna and an low noise block (LNB) amplifier, and an indoor unit, commonly referred to as a integrated receiver decoder (IRD). The IRD comprises the tuner and the signal processing section. The signal processing section of the IRD produces a plurality of timing signals or clocks, some generated by voltage controlled crystal oscillators (VCXO), used to tune the desired television signal to be displayed at the request of the user.

A VCXO oscillates at a certain frequency in response to a bit rate multiplier number (BRM). As the BRM is varied, the output frequency of the VCXO changes. Typically, during factory setup of the IRD, the appropriate BRM value is determined for a particular range of VCXO output frequencies and these BRM values are stored in a non volatile memory. However, physical attributes of the crystal and the environment, such as temperature, cut frequency, and age of the crystal, in which the IRD is used can affect the frequency output of the VCXO. One particular problem associated with VCXO drift is the ability of the IRD to generate the color subcarrier, where the VCXO must maintain a frequency of 27 MHz which is used by a PLL to generate 3.579545 MHz. Any discrepancy in this VCXO or the associated BRM could prevent the display from locking onto the colorburst signal thereby causing the video signal to be displayed in monochrome, partial color, and/or with color shifts.

To compensate for any discrepancy in the VCXO, the IRD microprocessor will track the interval between timestamps included in the incoming satellite signal and compare this interval with an interval similarly derived from a local clock based on the output frequency of the VCXO. If the compared intervals vary significantly, the microprocessor will alter the BRM to correct the VCXO clock output. Typically an acceptable variation for the VCXO clock is less than 15 ppm. As the physical attributes of the crystal or the environment change from those present during factory setup of the IRD, the time required for the microprocessor to adjust the BRM becomes more significant and increasingly unacceptable. Furthermore, if there is no reference timestamp present, this process becomes impossible and the microprocessor will be unable to adjust the factory set BRM value to compensate for deviations. It would be desirable to be able to correct for changes in the physical attributes of the crystal or the environment in the instances when no time stamps are available for the microprocessor to use for comparison.

SUMMARY OF THE INVENTION

In one aspect, the present invention involves a method for setting a voltage controlled crystal oscillator in a video processing device comprising the steps of receiving a television signal, determining a first value from said television signal and replacing a second value stored in a memory with said first value. In a second aspect, the present invention involves an apparatus comprising, a memory for storing a first oscillator parameter, an input for receiving a television signal comprising time reference data and a processing means for determining a second oscillator parameter in response to said time reference data and storing said second oscillator parameter in said memory.

DETAILED DESCRIPTION OF THE PREFERRED EMBODIMENT

The characteristics and advantages of the present invention will become more apparent from the following description, given by way of example. One embodiment of the present invention may be included within an integrated circuit. Another embodiment of the present invention may comprise discrete elements forming a circuit. The exemplifications set out herein illustrate preferred embodiments of the invention, and such exemplifications are not to be construed as limiting the scope of the invention in any manner.

The present invention concerns a method and apparatus for setting a frequency reference in an integrated receiver decoder (IRD). More specifically, the preset invention discloses an electrical circuit arrangement in which the voltage controlled crystal oscillator (VCXO) is set to oscillate at the desired frequency prior to the initial use thereof. Preferably, the VCXO is set so that the IRD is able to generate the colorburst signal from the in-coming data signal to thereby correctly generate a color sub-carrier for the incoming data signal. The IRD has a non-volatile memory unit for storing the BRM value corresponding to the frequency at which the VCXO operates. Upon receiving the data signal, the IRD uses a threshold value to compare the clock of the incoming data signal with the locally generated clock. If the clock difference exceeds a predetermined value, BRM value is adjusted to reduce the difference. If the new BRM value differs from the BRM value stored in non-volatile memory, the new value is stored in non-volatile memory. An alternative method would be to save the BRM value corresponding to the locked frequency in non-volatile memory when power is removed. This saved value would be used the next time the IRD is powered up.

The present invention may be implemented in a set-top box or video decoder that is capable of receiving a satellite signal or cable television signal. Such a system usually receives encoded packets of data representing video and audio information in compressed form. Part of the packetized incoming data signal is the video signal that is encoded such that a color signal can be generated and viewed upon being decoded at the proper frequency. Thus it is important for the VCXO to be configured to oscillate at the proper frequency.

Figure 1:
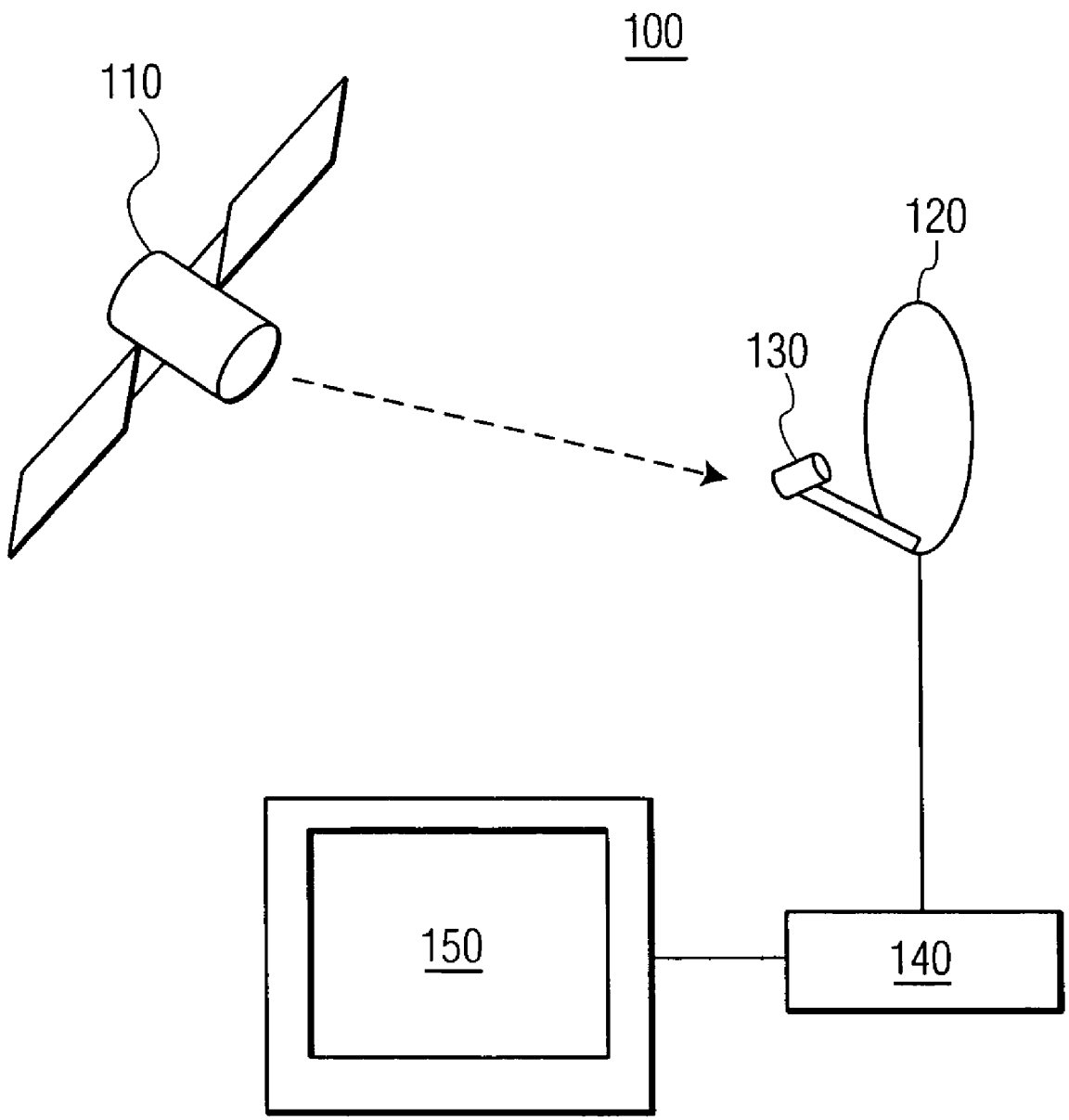
FIG. 1 is a block diagram of an exemplary embodiment of a digital satellite broadcast system.

Referring to FIG. 1, a diagram of an exemplary embodiment of a satellite television system is shown. FIG. 1 shows a transmitting satellite (110), a parabolic dish antenna (120) with a low noise block (130), a digital satellite set-top box (140) and a television monitor (150).

A satellite broadcast system operates to broadcast microwave signals to a wide broadcast area. In a digital television broadcast system, this is accomplished by transmitting the signals from a geosynchronous satellite 110. A geosynchronous satellite 110 orbits the earth once each day at an altitude of approximately 35,786 kilometers above the earths surface. Since a digital television broadcast satellite 110 generally orbits around the equator it constantly remains in the same position with respect to positions on the ground. This allows a satellite receiving antenna 120 to maintain a fixed look angle.

A digital television transmitting satellite 110 receives a signal from an uplink transmitter and then rebroadcasts the signal back to earth. The altitude of the transmitting satellite 110 allows subscribers in a wide geographical area to receive the signal. However, the distance from the earth and the severe power conservation requirements of the satellite also result in a weak signal being received by the subscriber. It is therefore critical that the signal be amplified as soon as possible after it is received by the antenna. This requirement is achieved through the placement of a low noise block (LNB) 130 downconverter amplifier at the feed horn of the parabolic dish antenna 120.

Figure 2:
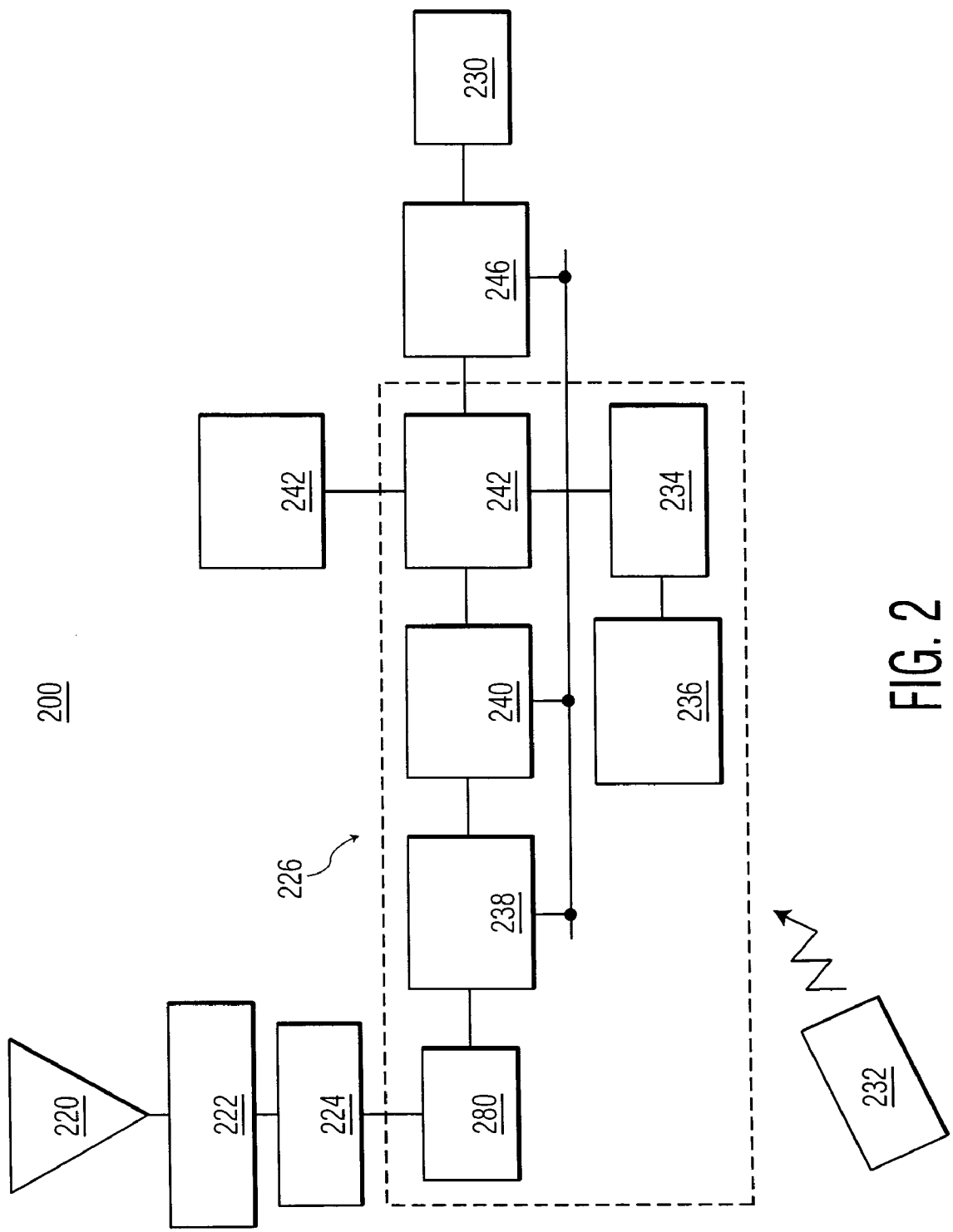
FIG. 2 is a block diagram of a multiformat television signal processing system.

Referring to FIG. 2 is a block diagram of an exemplary digital video receiving system (200) according to the present invention. System (200) includes an antenna (220) and an input processor (222) for together receiving and digitizing a broadcast carrier modulated with signals carrying audio, video, and associated data. System (200) also includes a demodulator (224) for receiving and demodulating the digital output from input processor (222). Further, system (200) includes a remote control unit (232) for receiving user input commands. System (200) also includes one or more digital-input-to-digital-output or digital-input-to-analog-output display driver(s) (246) and a respective digital-input or analog-input display (230) for together converting digital video picture data into visual representations. In the preferred embodiment, display (230) is a multiformat television display unit and, accordingly, display driver(s) (246) is a suitable digital-input-to-multiformat-output device. While the present invention is described in regard to the exemplary embodiment of FIG. 2 which includes a display device, the invention is also applicable to systems that do not include a display device such as set top boxes, video cassette recorders, and DVD players.

System (200) further includes a video processor (226). In general, video processor (226) receives user input commands from remote control unit (232), receives the demodulated data from demodulator (224), and transforms the demodulated data into video picture data for display driver(s) (246) in accordance with the user input commands. Accordingly, video processor (226) includes a remote interface (236) and a controller (234). Remote interface (236) receives user input commands from remote control unit (232). Controller (234) interprets the input commands and appropriately controls settings for various components of processor (226) to carry out the commands (e.g., channel and/or on-screen display ("OSD") selections). Video processor (226) further includes a decoder (280) for receiving the demodulated data from demodulator (224) and outputting a digital signal that is trellis decoded, mapped into byte length data segments, de-interleaved, and Reed-Solomon error-corrected. The corrected output data from decoder (280) is in the form of a Moving Picture Experts Group ("MPEG") standard compatible transport data stream containing program representative multiplexed audio, video, and data components.

Processor (226) further includes a decode packet identifier ("PID") selector (238) and a transport decoder (240). PID selector (238) identifies and routes selected packets in the transport stream from decoder (280) to transport decoder (240). Transport decoder (240) digitally demultiplexes the selected packets into audio data, video data, and other data for further processing by processor (226) as discussed in further detail below.

The transport stream provided to processor (226) comprises data packets containing program channel data, ancillary system timing information, and program specific information such as program content rating and program guide information. Using the program specific information, transport decoder (240) identifies and assembles individual data packets including the user selected program channel. Transport decoder (240) directs the ancillary information packets to controller (234) which parses, collates, and assembles the ancillary information into hierarchically arranged tables.

The system timing information contains a time reference indicator and associated correction data (e.g., a daylight savings time indicator and offset information adjusting for time drift, leap years, etc.). This timing information is sufficient for an internal decoder (e.g., MPEG decoder (242), discussed below) to convert the time reference indicator to a time clock (e.g., United States eastern standard time and date) for establishing a time of day and date of the future transmission of a program by the broadcaster of the program. The time clock is useable for initiating scheduled program processing functions such as program play, program recording, and program playback.

Meanwhile, the program specific information contains conditional access, network information, and identification and linking data enabling system (200) to tune to a desired channel and assemble data packets to form complete programs. The program specific information also contains ancillary program content rating information (e.g., an age based suitability rating), program guide information (e.g., an Electronic Program Guide ("EPG")) and descriptive text related to the broadcast programs as well as data supporting the identification and assembly of this ancillary information.

System (200) also includes an MPEG decoder (242). Transport decoder (240) provides MPEG compatible video, audio, and sub-picture streams to MPEG decoder (242). The video and audio streams contain compressed video and audio data representing the selected channel program content. The sub-picture data contains information associated with the channel program content such as rating information, program description information, and the like. MPEG decoder (242) decodes and decompresses the MPEG compatible packetized audio and video data from transport decoder (240) and derives decompressed program representative data therefrom.

MPEG decoder (242) also assembles, collates and interprets the sub-picture data from transport decoder (240) to produce formatted program guide data for output to an internal OSD module (not shown). The OSD module processes the sub-picture data and other information to generate pixel mapped data representing subtitling, control, and information menu displays including selectable menu options and other items for presentation on display (230). The control and information displays, including text and graphics produced by the OSD module, are generated in the form of overlay pixel map data under direction of controller (234). The overlay pixel map data from the OSD module is combined and synchronized with pixel representative data from decoder (242) under the direction of controller (234). Combined pixel map data representing a video program on the selected channel together with associated sub-picture data is encoded by MPEG decoder (242).

Figure 3:
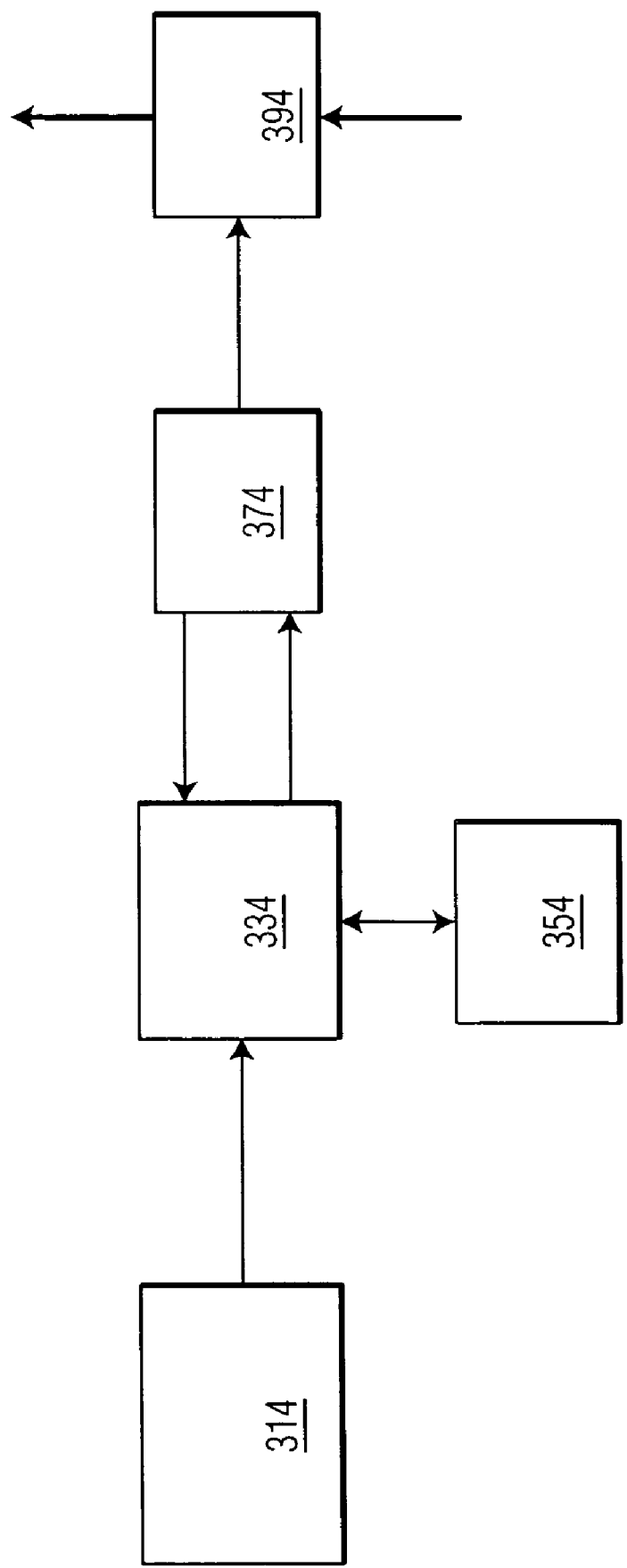
FIG. 3 is a block diagram of an exemplary embodiment of a frequency reference in an integrated receiver decoder.

FIG. 3 is a block diagram of an exemplary embodiment of a frequency reference in an integrated receiver decoder, shown according to the present invention. FIG. 3 shows a transport demultiplexer (314) a controller (334) a VCXO (374), a digital to analog converter (394) and a memory (354).

In system 300 at startup and during operation, the controller (334) applies a BRM value to the VCXO (374) such that the VCXO (374) generates a clock signal at a desired clock frequency. The clock frequency is chosen such that the color signal will be properly decoded. The transport demultiplexer (314) separates the incoming packetized information received from the demodulator (FIG. 2, 224). Among the different types of packetized information received, adaptation fields comprising time stamps are transmitted on the data bus to the controller (334). The controller (334) calculates the time interval between the local clock time at receipt time of the time stamp and the local clock time at receipt of the previous time stamp, and compares this with the time interval that is the difference between the two received time stamps. The controller (334) may alternatively convert the interval between time stamps to a representative BRM value and compare this value with a BRM value stored on the memory (354). If the controller (334) determines that the newly calculated time interval is significantly different from the interval stored on the memory (354), the controller (334) will save the new value to memory (354) and apply the BRM value associated with the new interval to the VCXO (374), thereby adjusting the output clock frequency of the VCXO (374). This has the desirable effect of correlating the VCXO (374) clock frequency with the time stamps of the received packetized data, thereby compensating for any physical changes relating to the VCXO crystal or the environmental effects on the IRD installation. The new clock frequency is then applied to the digital encoder (394) and may be fed back to the controller (334).

In an exemplary embodiment, the digital encoder (394) uses a VCXO (374) centered on 27.000000 MHz (+/−25 ppm) as its reference frequency. When a voltage is applied to the VCXO (374) varactors, the 27 MHz center frequency can be adjusted by approximately +/−150 ppm (+/−4050 Hz). This would correspond to a −4050 Hz for a 00 BRM value, and a +4050 Hz for a FF BRM value. Since there are 256 states for the BRM value and an approximate pull range of 8100 Hz then each BRM state is approximately 31.6 Hz.

The 27 MHz clock is used to generate Horizontal, Vertical, and Chroma burst timing. The Chroma burst timing is 27.000000 MHz/7.542858101=3.579545 Mhz. If the 27 MHz oscillator is at its lowest frequency, 26.995950 MHz then 26.995950/7.542858101=3.579008 MHz. When divided down a difference of 537 Hz from the FCC chroma burst frequency (3.579545 MHz) will exist. This difference is large enough to cause a loss of color on a television set. Typically, a television set has a PLL (phase lock loop) in the chroma circuits which allows its internal 3.579545 oscillator to lock to the incoming video burst frequency. This lock is needed for a color picture to occur. The typical lock range for a television set is +/−300 Hz. When the generated burst frequency is outside the lock range, then black and white picture will be displayed. If it close to the maximum lock range, then an effect for rainbow colors will be displayed on the television set. A television set could also display skewed colors on its screen if the chroma lock is achieved but close tracking is not maintained.

Figure 4:
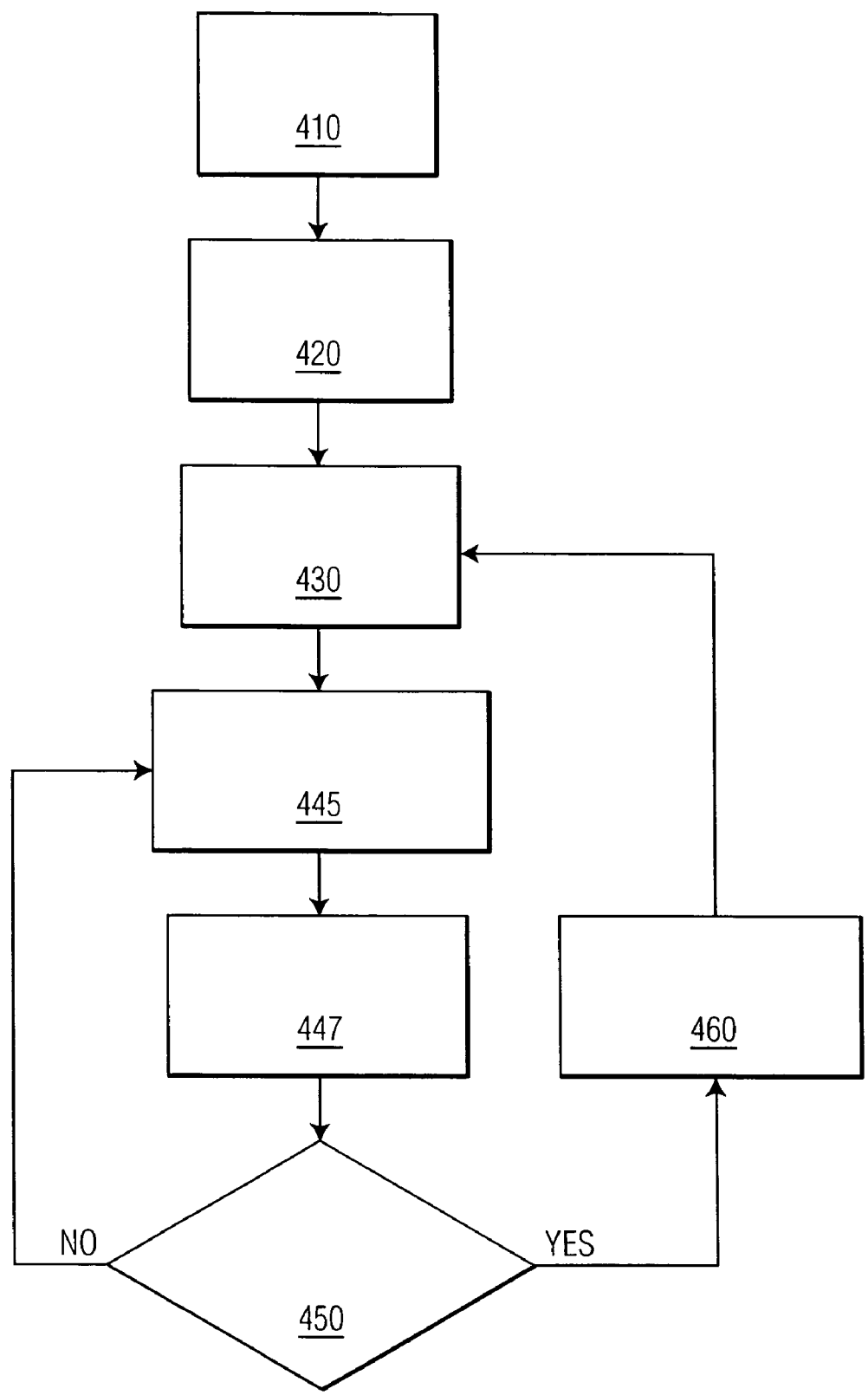
FIG. 4 is a flowchart that illustrates an exemplary embodiment of a process of updating a frequency reference in an integrated receiver decoder.

FIG. 4 is a flowchart that illustrates an exemplary embodiment of a process of updating a frequency reference in an integrated receiver decoder (140 of FIG. 1). During the startup procedure after being first powered on (410), the IRD will load the stored BRM value from the nonvolatile memory (420). The IRD then applies this BRM value to the VCXO to tune the satellite signal (430). Once the IRD locks in the satellite signal the controller will receive data packets comprising time stamps indicating the time the packets were transmitted from the satellite (445). After at least two of these time stamps are received, the controller calculates a desired BRM value for the VCXO based on the time interval between the two or more of the received time stamps (447) The controller the compares this desired BRM value against the BRM value being applied to the VCXO (450). If the desired value is significantly different from the applied BRM value, the controller stores the desired BRM value in the nonvolatile memory (460), loads this BRM value from the nonvolatile memory (420), and then applies this new BRM value to the VCXO (430). The processes of determining a new BRM value (445), comparison (450) and possible update (460) is then repeated after a predetermined time interval. However, if the desired BRM value is not significantly different from the stored BRM value, the BRM value is not updated and the processes of determining an new BRM value (445), comparison (450) and possible update (460) is then repeated after a predetermined time interval.

Figure 5:
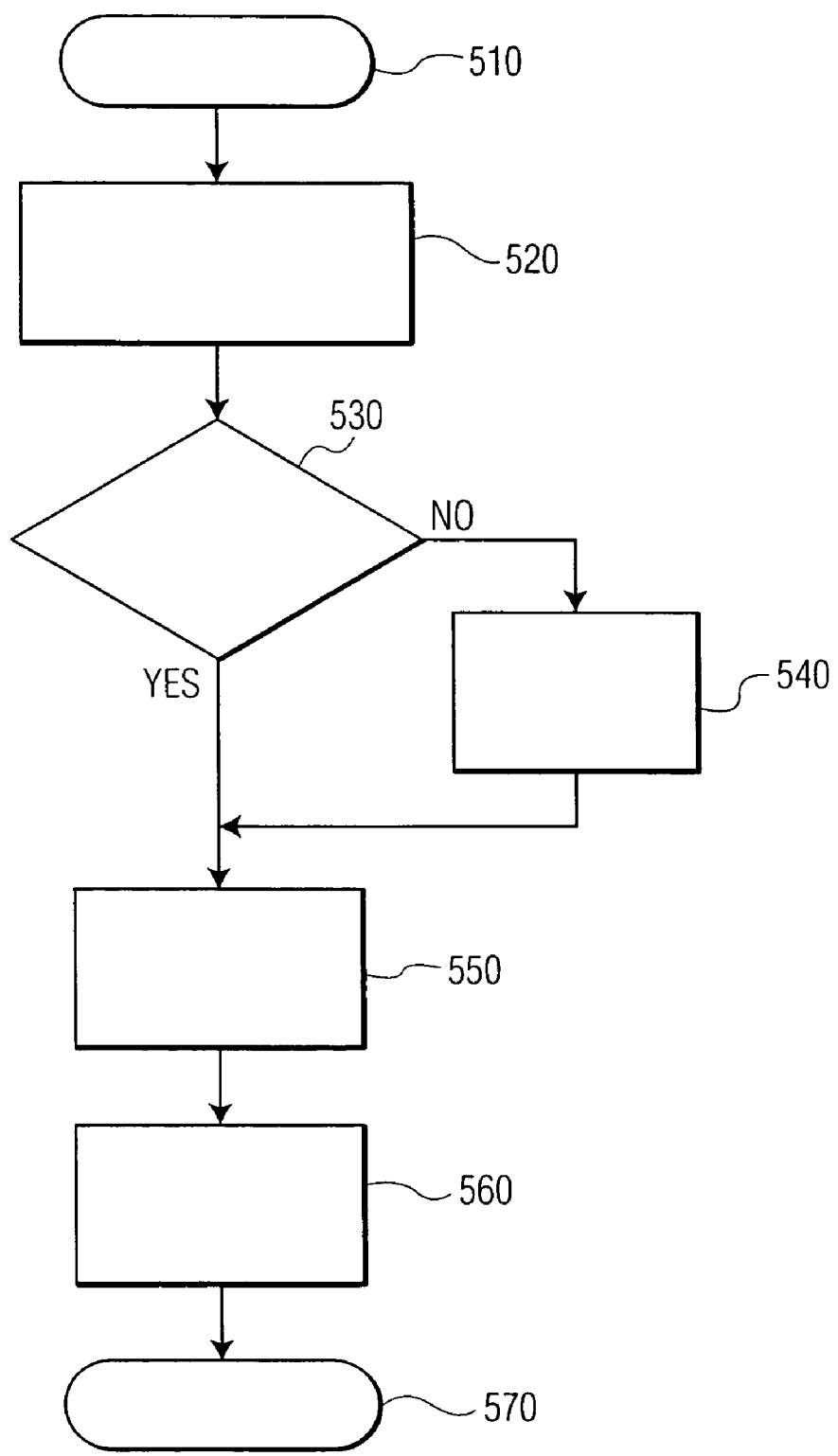
FIG. 5 shows a flowchart that illustrates an exemplary embodiment of a process of initializing the updating of a frequency reference in an integrated receiver decoder.

FIG. 5 shows a flowchart that illustrates an exemplary embodiment of a process of initializing the updating of a frequency reference in an integrated receiver decoder (140 of FIG. 1). After an new BRM value is calculated by the controller, the process of updating the BRM value applied to the VCXO is initiated (510). The controller reads the BRM value from a memory, such as an EEPROM (520). The controller then determines if the BRM value is a valid value (530). If the BRM value is not valid, the controller continues to use the default BRM value (540). If the value is valid, the controller replaces the default BRM value with the calculated BRM value (550). The controller then changes the adjustment state for adjusting the BRM value applied to the VCXO to fine (560). The controller then returns to operational state (570).

Figure 6:
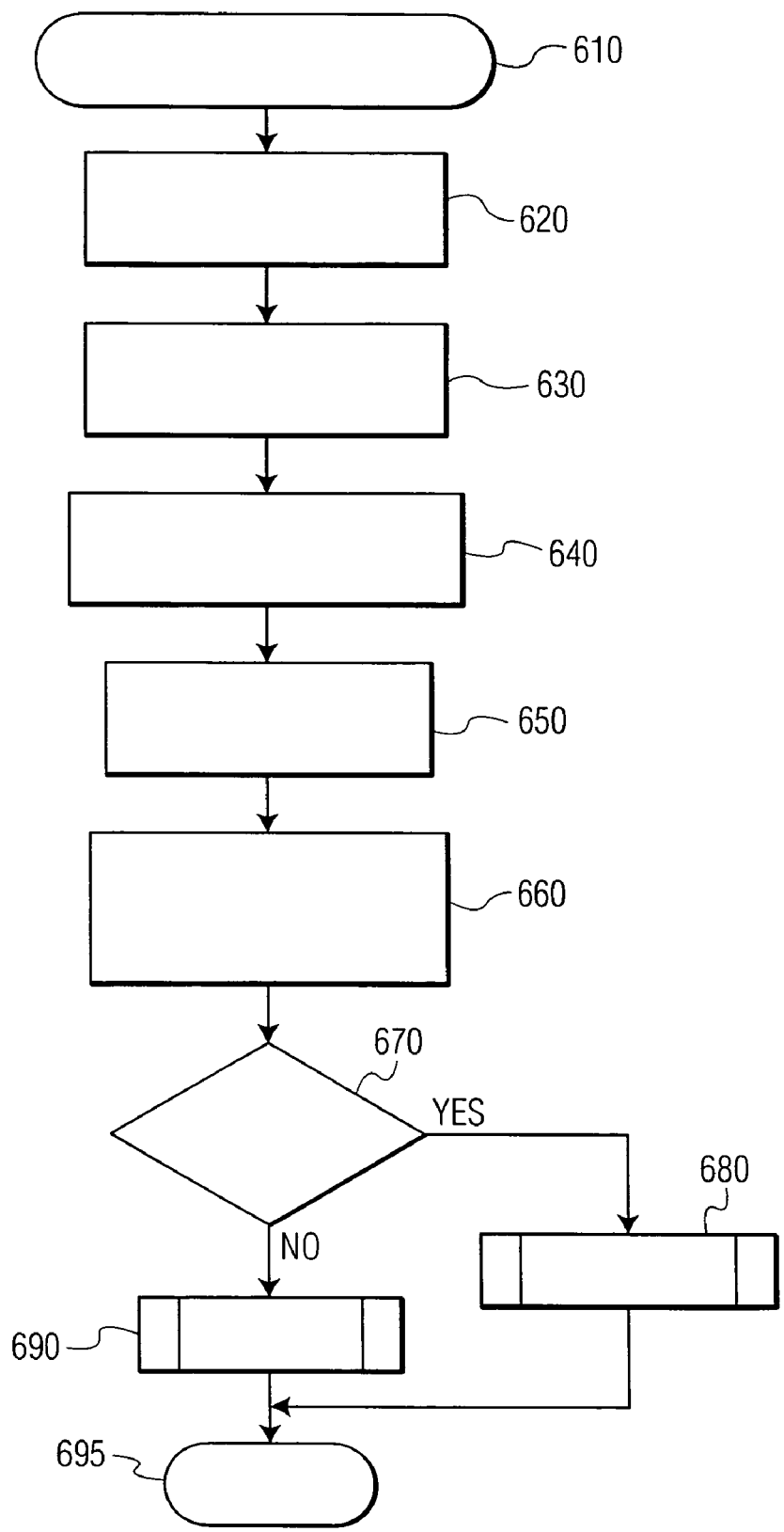
FIG. 6 shows a flowchart that illustrates an exemplary embodiment of a process of interrupting operation to update the stored BRM value of a frequency reference in an integrated receiver decoder.

FIG. 6 shows a flowchart that illustrates an exemplary embodiment of a process of interrupting operation to update the stored BRM value of a frequency reference in an integrated receiver decoder (140 of FIG. 1). After a period of time has elapsed since the previous BRM update, the controller will monitor the Incoming data signals until an adaptation packet containing a time stamp is received. After the adaptation packet containing a time stamp is received, the operation of the controller is interrupted (610). An exemplary period of time between BRM updates could be 1 second, but may be longer or shorter depending on the system operational requirements and/or design goals. One the interrupt has been generated, the controller latches the local clock to get a value, called the local clock reference (LCR) in this embodiment, representing the local time when the time stamp in the adaptation field was received (620). Next, the previous controller saves the previously stored LCR into a alternate memory location (630). The controller then stores the new local clock reference to the primary local clock reference memory location (640). The previously stored system clock reference (SCR), calculated from the previously received time stamp in an adaption field is stored to an alternate SCR memory location (650). The newly received SCR is then stored in the primary SCR memory location (660). The controller then checks the appropriate memory value to determine the BRM adjustment state reference variable (670). If the stored state reference variable is equal to rough, the controller executed the rough adjust subroutine (680). If the stored state reference variable is not equal to rough, the controller executed the fine adjust subroutine (690). After the appropriate subroutine is completed, the controller returns to its operational state (695).

Figure 7:
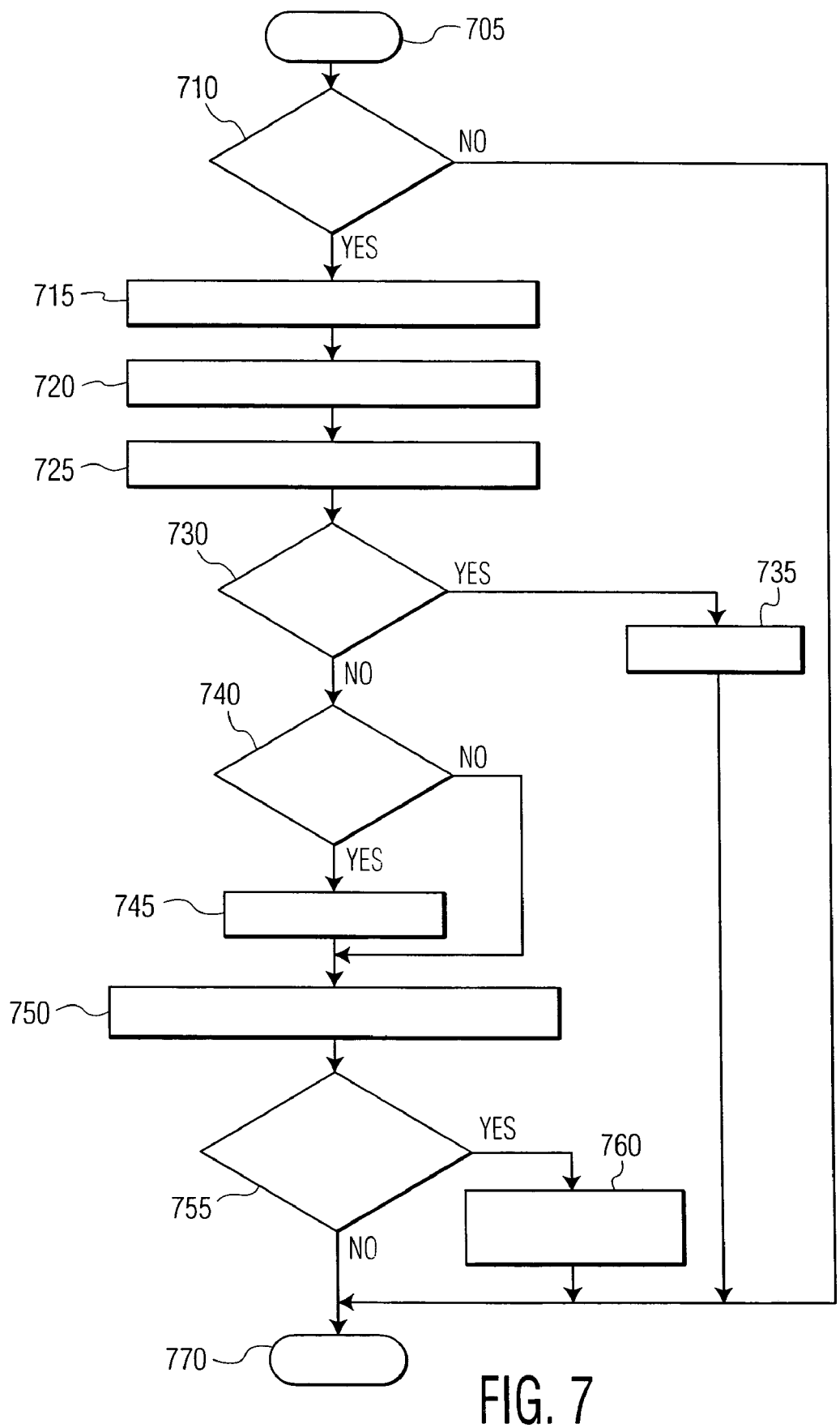
FIG. 7 shows a flowchart that illustrates an exemplary embodiment of a process of fine adjusting the BRM of a frequency reference in an integrated receiver decoder.

FIG. 7 shows a flowchart that Illustrates an exemplary embodiment of a process of fine adjusting the BRM of a frequency reference in an integrated receiver decoder (140 of FIG. 1). The interrupt routine described in FIG. 6 or the rough adjust subroutine described in FIG. 8 initiate the fine adjust subroutine (705). First the controller, decides if an appropriate interval has passed since the last time the BRM value was calibrated (710). If an appropriate time interval has passed, where in this embodiment the interval is 1 second, a system clock reference delta is calculated by subtracting the previous SCR value from the new SCR value (715). A local clock reference delta is then calculated by subtracting the previous local clock reference value from the new local clock reference value (720). The clock error is then calculated by subtracting the local clock reference delta from the system clock reference delta (726). If the clock error is greater than a predetermined fine adjust threshold, the controller initiates the rough adjust subroutine (735). If the clock error is less than the predetermined fine adjust threshold, the controller then determines if the clock error is greater than the BRM resolution (740). Since the BRM value is a digital value, it has a finite number of values, as described in the description of FIG. 4, in can only be adjusted if the clock error is greater than half of the BRM resolution. In this exemplary embodiment, the BRM value is adjusted if the clock resolution is greater than the BRM resolution (745). If the clock error is less than the BRM resolution value, the BRM value is not adjusted. After the controller adjusts the BRM value or not, the BRM delta is calculated by subtracting the current BRM value from the BRM value stored in memory (750). If the BRM delta value is greater than a previously determined new BRM threshold, the current BRM value is stored in the memory in place of the previous BRM value stored in memory (760). If the BRM delta does is not greater than the new BRM threshold, the controller does not store the current BRM value to the memory and the previous BRM value is retained. The controller then returns to the interrupt subroutine (770).

Figure 8:
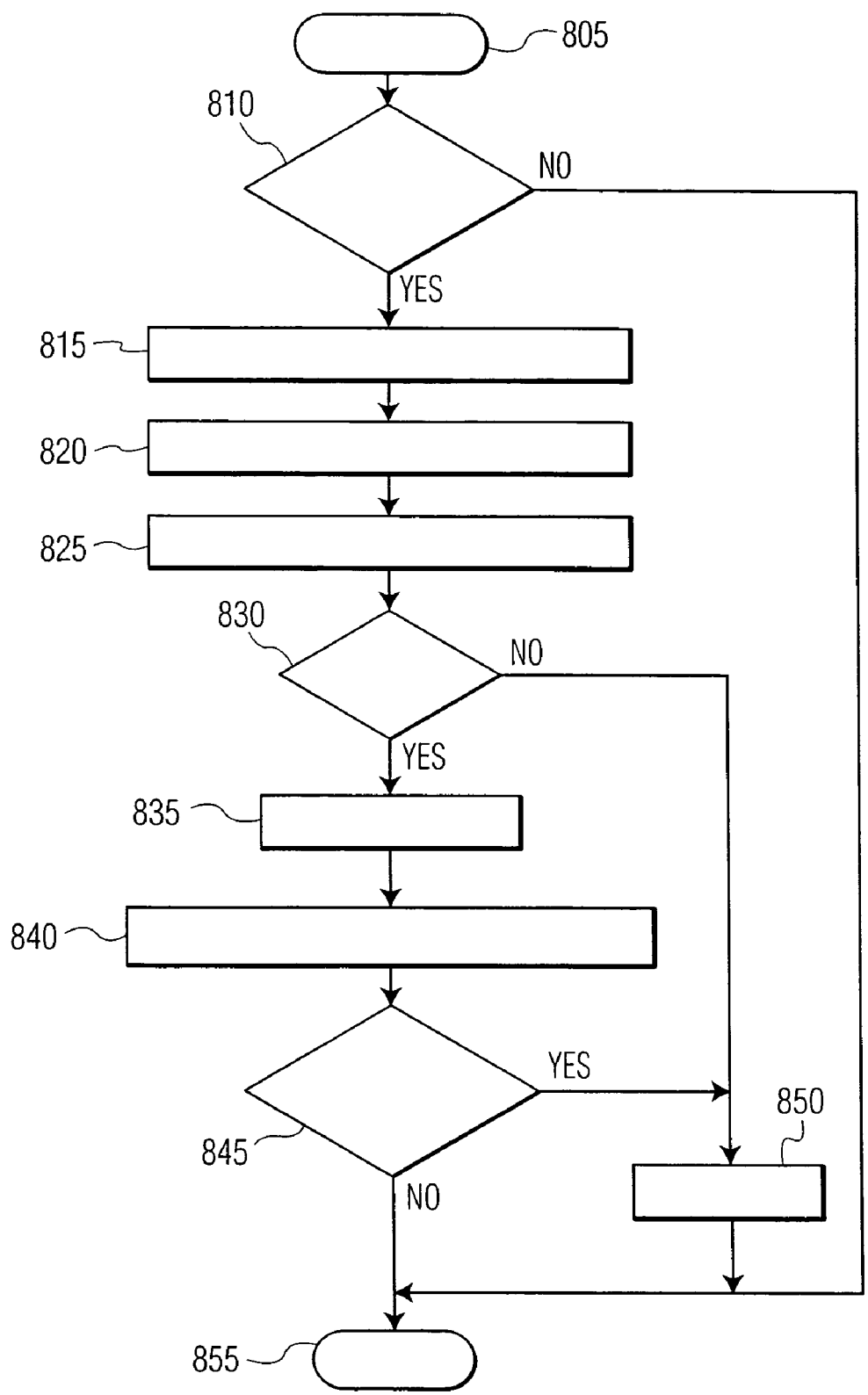
FIG. 8 shows a flowchart that illustrates an exemplary embodiment of a process of rough adjusting the BRM of a frequency reference in an integrated receiver decoder.

FIG. 8 shows a flowchart that Illustrates an exemplary embodiment of a process of rough adjusting the BRM of a frequency reference in an integrated receiver decoder (140 of FIG. 1). The interrupt routine described in FIG. 6 or the fine adjust routine described in FIG. 7 can Initiate the rough adjust subroutine in this embodiment (805). First the controller, decides if an appropriate interval has passed since the last time the BRM value was calibrated (810). If an appropriate time interval has passed, where in this embodiment the interval is 1 second, a system clock reference delta is calculated by subtracting the previous SCR value from the new SCR value (815). A local clock reference delta is then calculated by subtracting the previous local clock reference value from the new local clock reference value (820). The clock error is then calculated by subtracting the local clock reference delta from the system clock reference delta (825). If the clock error is greater than a predetermined fine adjust threshold, in this exemplary embodiment the threshold is 0, the controller adjusts the BRM value (835). IF the clock error is less than the clock error threshold the fine adjust subroutine is initiated (850). After the controller adjusts the BRM value, the BRM delta is calculated by subtracting the current BRM value from the BRM value stored in memory (840). If the BRM delta value is less than a previously determined rough threshold the fine adjust subroutine is initiated (850). After the fine adjust subroutine is completed, the subroutine from which the rough adjust subroutine was initiated is returned to (855). If the rough adjust threshold is not exceed, the subroutine from which the rough adjust subroutine was initiated is returned to (855).

While the present invention has been described with reference to the preferred embodiments, it is apparent that various changes may be made in the embodiments without departing from the spirit and the scope of the invention, as defined by the appended claims.

The invention claimed is:

1. A method for adjusting the frequency of a local oscillator, comprising the steps of:
   receiving a television signal at a television signal receiving device;
   determining a first bit rate multiplier value for adjusting the frequency of a local oscillator from said television signal, wherein said first bit rate multiplier is determined by receiving a first data packet, receiving a second data packet, determining a difference between the information received in said first data packet and the information in said second data packet, and determining said first value in response to said difference; and
   replacing a second bit rate multiplier value for adjusting the frequency of a local oscillator, stored in a memory of said television signal receiving device, with said first bit rate multiplier value for adjusting the frequency of a local oscillator, determined from said television signal.

2. The method of claim 1 wherein the step of replacing said second value with said first value is performed only in response to said first value being different than said second value.

3. The method of claim 1 wherein the step of replacing said second value with said first value is performed only in response to said first value being greater than 15 parts per million different than said second value.

4. The method of claim 1 wherein the step of replacing said second value with said first value is performed only in response to said first value being greater than 0.0015% different than said second value.

5. The method of claim 1 wherein the information received in said first data packet and said second data packet are time references.

6. An television signal receiving apparatus comprising:
- a memory for storing a first oscillator bit rate multiplier parameter;
- an input for receiving a television signal comprising time reference data; and
- a processing means for determining a second oscillator bit rate multiplier parameter in response to said time reference data and storing said second oscillator bit rate multiplier parameter in said memory, wherein said processor replaces said first oscillator parameter with said second oscillator parameter in response to when said second oscillator parameter being greater than 0.0015% different than said first oscillator parameter.

7. The apparatus of claim 6 wherein said processor replaces said first oscillator parameter with said second oscillator parameter in response to said second oscillator parameter being different than said first oscillator parameter.

8. The apparatus of claim 6 wherein said first oscillator parameter and said second oscillator parameter is a bit rate multiplier value.

9. A method for updating a digital video signal processor parameter comprising a processing means for:
- extracting a first time stamp from a first data packet,
- extracting a second time stamp from a second data packet;
- determining the time interval between the first time stamp and the second time stamp;
- calculating a video signal processor bit rate multiplier parameter based on said time interval;
- replacing a stored video signal processor bit rate multiplier parameter with said video signal processor parameter.

10. The method of claim 9 wherein said stored video signal processor parameter is replaced with said video signal processor parameter only in response to said video signal processor parameter being different than said stored video signal processor parameter.

11. The apparatus of claim 9 wherein said stored video signal processor parameter is replaced with said video signal processor parameter only in response to said video signal processor parameter being greater than 0.0015% different than said stored video signal processor parameter.

12. The apparatus of claim 9 wherein said stored video signal processor parameter is replaced with said video signal processor parameter only when said video signal processor parameter is greater than 15 parts per million different than said stored video signal processor parameter.

* * * * *